United States Patent
King et al.

(10) Patent No.: US 7,895,029 B2
(45) Date of Patent: Feb. 22, 2011

(54) SYSTEM AND METHOD OF AUTOMATING THE ADDITION OF RTL BASED CRITICAL TIMING PATH COUNTERS TO VERIFY CRITICAL PATH COVERAGE OF POST-SILICON SOFTWARE VALIDATION TOOLS

(75) Inventors: Matthew Edward King, Pflugerville, TX (US); Charles Leverett Meissner, Austin, TX (US); Todd Swanson, Round Rock, TX (US); Michael Ellett Weissinger, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 622 days.

(21) Appl. No.: 11/927,846

(22) Filed: Oct. 30, 2007

(65) Prior Publication Data

US 2009/0112557 A1 Apr. 30, 2009

(51) Int. Cl.
*G06F 17/50* (2006.01)
(52) U.S. Cl. .............................. 703/15; 716/6; 716/18
(58) Field of Classification Search .................. 703/15; 716/6, 18
See application file for complete search history.

(56) References Cited

U.S. PATENT DOCUMENTS

| | | | | |
|---|---|---|---|---|
| 5,703,789 A * | 12/1997 | Beausang et al. | ............... | 716/4 |
| 6,024,478 A * | 2/2000 | Yamamoto | ................... | 716/5 |
| 6,106,568 A * | 8/2000 | Beausang et al. | ............. | 716/18 |
| 6,263,483 B1 * | 7/2001 | Dupenloup | .................. | 716/18 |
| 6,301,688 B1 * | 10/2001 | Roy | .............................. | 716/4 |
| 6,421,818 B1 * | 7/2002 | Dupenloup et al. | ........... | 716/18 |
| 6,578,183 B2 * | 6/2003 | Cheong et al. | ................. | 716/7 |
| 6,701,505 B1 * | 3/2004 | Srinivasan | .................... | 716/10 |
| 6,725,432 B2 * | 4/2004 | Chang et al. | .................... | 716/4 |
| 6,836,877 B1 * | 12/2004 | Dupenloup | .................. | 716/18 |
| 7,296,249 B2 * | 11/2007 | Rinderknecht et al. | ......... | 716/4 |
| 7,555,689 B2 * | 6/2009 | Goswami et al. | ............ | 714/741 |
| 7,630,876 B1 * | 12/2009 | Bowlby et al. | ................ | 703/14 |
| 7,720,664 B2 * | 5/2010 | Takaba et al. | ................. | 703/15 |

* cited by examiner

*Primary Examiner*—Dwin M Craig
(74) *Attorney, Agent, or Firm*—VanLeeuwen & VanLeeuwen; Matthew B. Talpis

(57) ABSTRACT

A system and method for modifying a simulation model and optimizing an application program to produce valid hardware-identified operating conditions that are matched with simulator-identified operating conditions in order to modify a simulator accordingly is presented. A critical path coverage analyzer includes critical path measurement logic into a simulation model that injects errors into the critical path and provides visibility into the number of times that an application program exercises the critical path. The critical path coverage analyzer uses the critical path measurement logic to optimize an application program to adequately exercise and test the critical paths. Once optimized, the critical path coverage analyzer runs the optimized application program on a hardware device to produce hardware-identified operating conditions. The hardware-identified operating conditions are matched against simulator-identified operating conditions. When discrepancies exist, the simulator is modified accordingly to match the hardware-identified operating conditions.

20 Claims, 10 Drawing Sheets

SYSTEM AND METHOD OF AUTOMATING THE ADDITION OF RTL BASED CRITICAL TIMING PATH COUNTERS TO VERIFY CRITICAL PATH COVERAGE OF POST-SILICON SOFTWARE VALIDATION TOOLS

BACKGROUND OF THE INVENTION

1. Technical Field

The present invention relates to a system and method for verifying critical path coverage of post-silicon software validation tools. More particularly, the present invention relates to a system and method for modifying a simulation model and optimizing an application program to identify valid "hardware-identified operating conditions" that are matched with "simulator-identified operating conditions" in order to enhance a simulator's accuracy.

2. Description of the Related Art

Current post-silicon pseudo-random software validation tools are primarily used for functional verification. Due to their random nature and their ability to exercise many areas of the microprocessor, they may also be used for product characterization. One aspect of a microprocessor design that affects its characterization is the design's critical timing paths, which may lead to issues such as race conditions.

Existing art provides a few approaches for verifying critical paths, such as LBIST (Logic Built In Self Test) and test pattern usage on a manufacturing tester. A challenge found with LBIST, however, is that LBIST is not truly random and has limited critical path coverage based upon the amount of time that the LBIST executes. A challenge found with executing test patterns on a manufacturing tester is that the critical paths are targeted with a specific verified pattern, which does not produce a real-life operational environment and, therefore, does not account for issues such as transient power characteristics.

What is needed, therefore, is a system and method for verifying critical path coverage of post-silicon validation tools based upon a real-life environment.

SUMMARY

It has been discovered that the aforementioned challenges are resolved using a system and method for modifying a simulation model and optimizing an application program to produce valid hardware-identified operating conditions that are matched with simulator-identified operating conditions in order to enhance a simulator's accuracy. A critical path coverage analyzer incorporates critical path measurement logic into a simulation model, which injects errors into the critical path and identifies the number of times that an application program exercises the critical path. The critical path coverage analyzer uses the critical path measurement logic to optimize an application program by ensuring that the application program fully exercises and tests the critical paths. Once optimized, the critical path coverage analyzer executes the optimized application program on a hardware device to produce hardware-identified operating conditions. The hardware-identified operating conditions are matched against simulator-identified operating conditions, and when discrepancies exist, a simulation team modifies the simulator accordingly in order to match the hardware-identified operating conditions.

A timing analyzer performs timing analysis on a physical design file (e.g., netlist), and generates timing results that include critical path information. The critical path information identifies one or more critical paths included in a corresponding physical design file, such as a critical path between two registers. Next, a critical path coverage analyzer identifies the critical paths from the timing results and recursively traverses the physical design file to identify a critical path logic cone that comprises the critical path logic. In addition, the critical path coverage analyzer identifies areas in which to add checking logic and error injection logic in order to guarantee visibility after synthesis. The critical path coverage analyzer then modifies a simulation model (RTL model) by including critical path measurement logic into the simulation model, which includes the critical path logic cone, the checking logic, and the error injector logic.

The critical path coverage analyzer then retrieves an application program for which to execute on the modified simulation model using a simulator. Once simulated, the critical path coverage analyzer determines whether the application program adequately exercised one or more of the critical paths by checking critical path counter values included in the inserted critical path measurement logic. The critical path coverage analyzer modifies the application program accordingly in order to ensure that the application program adequately exercises each of the critical paths.

Next, the critical path coverage analyzer runs the modified application program on the modified simulation model again using the simulator and injects errors into the critical paths during times at which the modified application program exercises the critical paths in order to determine whether the modified application program detects the injected errors. If not, the critical path coverage analyzer optimizes the modified application program accordingly.

Once the critical path coverage analyzer optimizes the application program, the critical path coverage analyzer executes the optimized application program on a hardware device in order to detect real-life hardware-identified operating conditions, such as the hardware device's operating frequency and voltage range. The critical path coverage analyzer passes the hardware-identified operating conditions to a simulation team that, in turn, analyzes the hardware-identified operating conditions and compares them against simulator-identified operating conditions that are generated by the simulator. When discrepancies exist, the simulation timing team modifies the simulator accordingly in order for the simulator to match the hardware-identified operating conditions.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
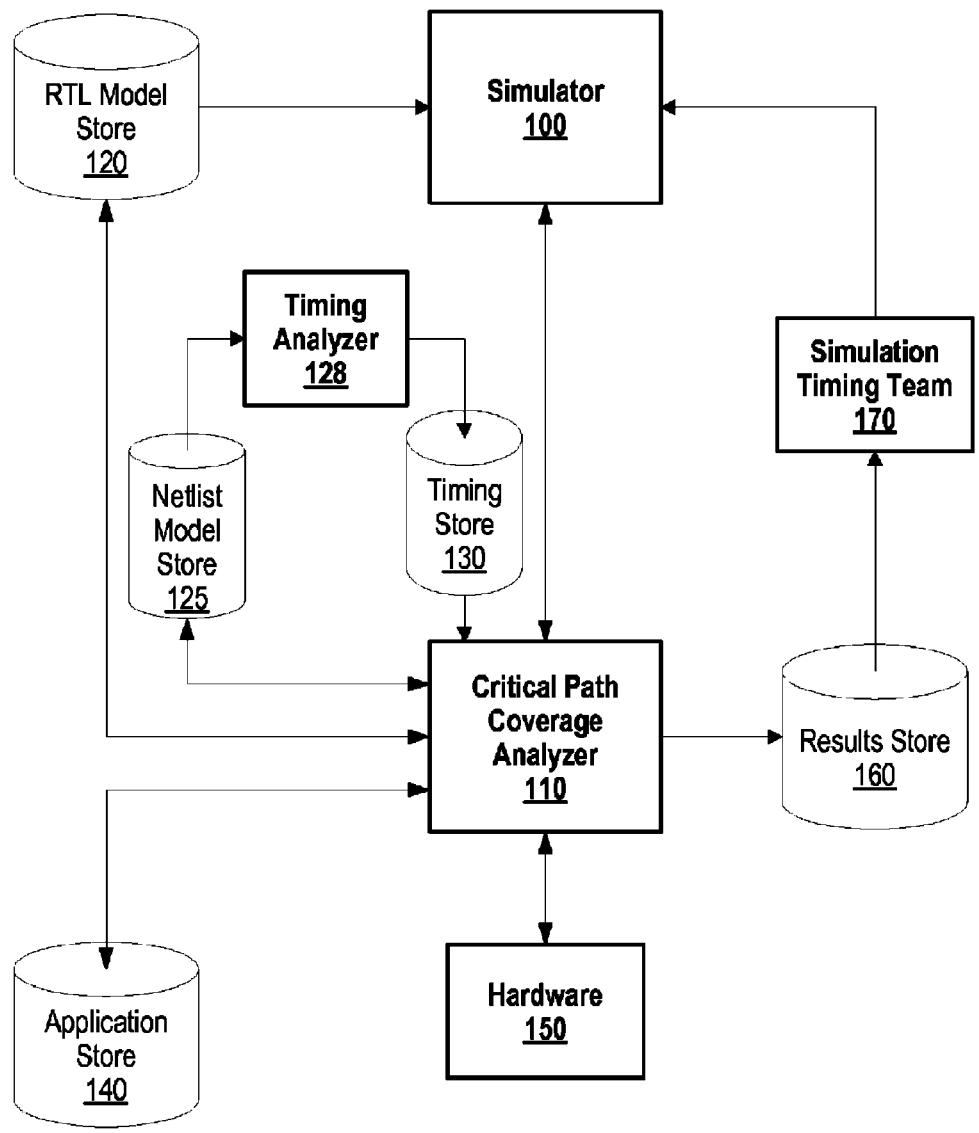
FIG. 1 is a diagram showing a critical path coverage analyzer modifying a simulation model and optimizing an application program in order to test critical path coverage aspects of a hardware simulator.

FIG. 1 is a diagram showing a critical path coverage analyzer modifying a simulation model and optimizing an application program in order to test critical path coverage aspects of a hardware simulator.

Critical path coverage analyzer 110 generates a simulation model and a physical design model from a physical design file. Critical path coverage analyzer stores the simulation model in RTL model store 120 and stores the physical design model in netlist model store 125. Timing analyzer 128 generates timing results by performing timing analysis on the physical design model, which are stored in timing store 130. The timing results include critical path information that identifies one or more critical paths between components that are included in the physical design file, such as a critical path between two registers. Model store 120, netlist model store 125, and timing store 130 may be stored on a nonvolatile storage area, such as a computer hard drive.

Next, critical path coverage analyzer 110 retrieves the timing results from timing store 130 and identifies the critical paths. Critical path coverage analyzer 110 then recursively traverses the physical design file to identify a critical path logic cone that comprises the critical path logic (see FIG. 2 and corresponding text for further details). In addition, critical path coverage analyzer 110 identifies areas in which to add checking logic and error injection logic in order to guarantee visibility after synthesis. Critical path coverage analyzer 110 then modifies the simulation model by including critical path measurement logic into the simulation model, which includes the critical path logic cone, the checking logic, and the error injector logic. Critical path coverage analyzer 110 stores the modified simulation model in model store 120.

Critical path coverage analyzer 110 then retrieves an application program from application store 140 to execute on the modified simulation model using simulator 100. Once simulated, critical path coverage analyzer 110 determines whether the application program adequately exercised one or more of the critical paths by checking critical path counter values included in the inserted critical path measurement logic. Critical path coverage analyzer 110 modifies the application program accordingly in order to ensure that the application program adequately exercises each of the critical paths. Application store 140 may be stored on a nonvolatile storage area, such as a computer hard drive.

Next, critical path coverage analyzer 110 runs the modified application program on the modified simulation model again using simulator 100 and injects errors into the critical paths at times at which the modified application program exercises the critical paths. This is done in order to determine whether the modified application program detects the injected errors. If not, critical path coverage analyzer 110 optimizes the modified application program in order for the application program to detect the injected errors.

Once critical path coverage analyzer 110 optimizes the application program, critical path coverage analyzer 110 runs the optimized application program on hardware 150 in order to detect hardware-identified operating conditions, such as hardware 150's operating frequency and voltage range. Critical path coverage analyzer 110 stores the hardware-identified operating conditions in results store 160. Results store 160 may be stored on a nonvolatile storage area, such as a computer hard drive.

Simulation timing team 170 analyzes the hardware-identified operating conditions and compares them against simulator-identified operating conditions that are generated by simulator 100. When discrepancies exist, simulation timing team 170 modifies simulator 100 accordingly in order for simulator 100 to match hardware 150's hardware-identified operating conditions.

Figure 2:
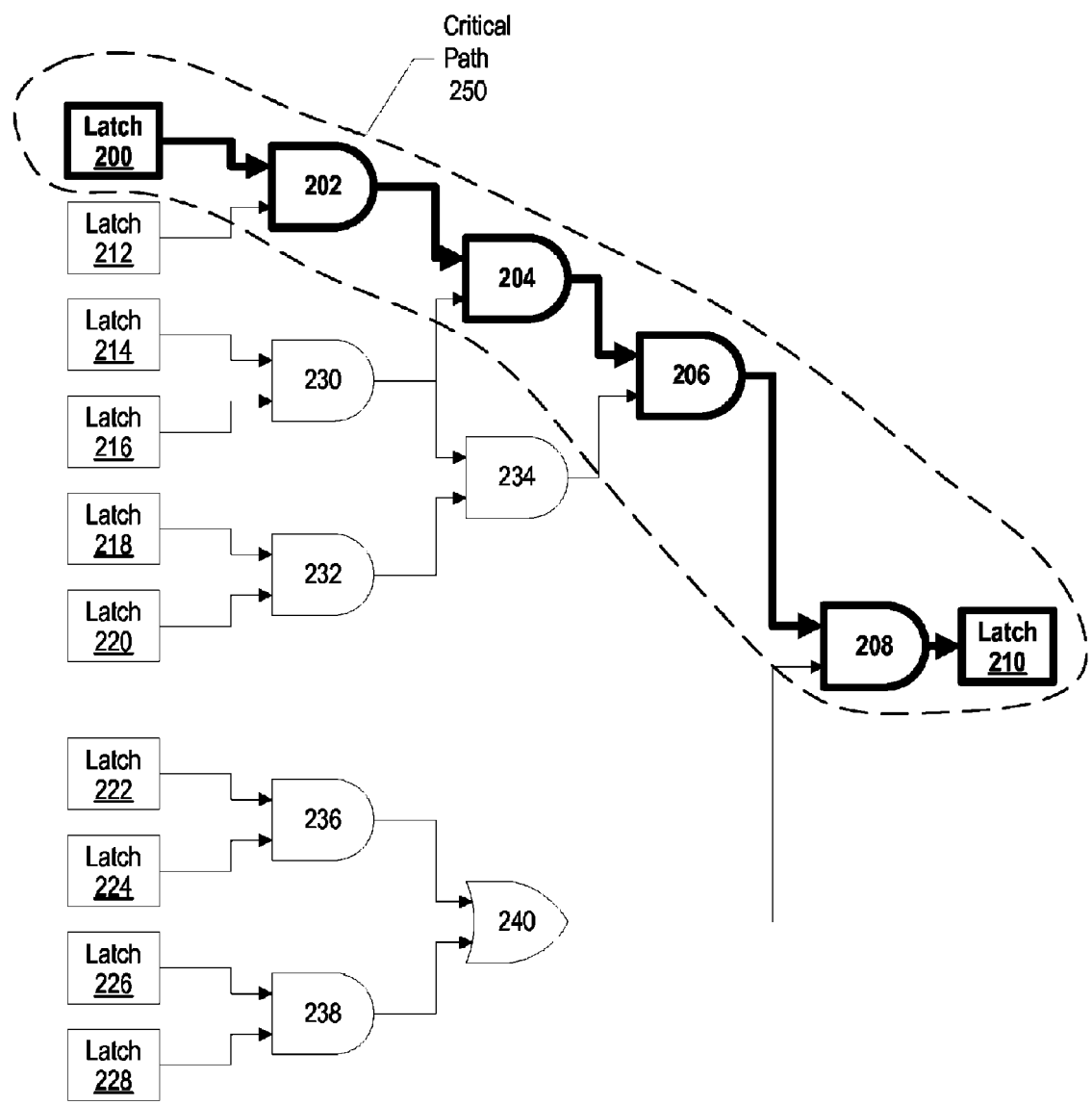
FIG. 2 is a diagram showing critical path cone logic that includes logic corresponding to a critical path.

FIG. 2 is a diagram showing critical path cone logic that includes logic corresponding to a critical path. A simulator produces timing results after simulating a simulation model that includes one or more critical path areas. A critical path coverage analyzer traverses a corresponding physical design file to identify a cone of combinational logic that triggers the critical path. Latches 200, 210, 212-228, gates 202-208, and 230-240 comprise an example of a cone of combinational logic that triggers critical path 250 along latch 200, through gates 202-208, an onto latch 210.

Figure 3:
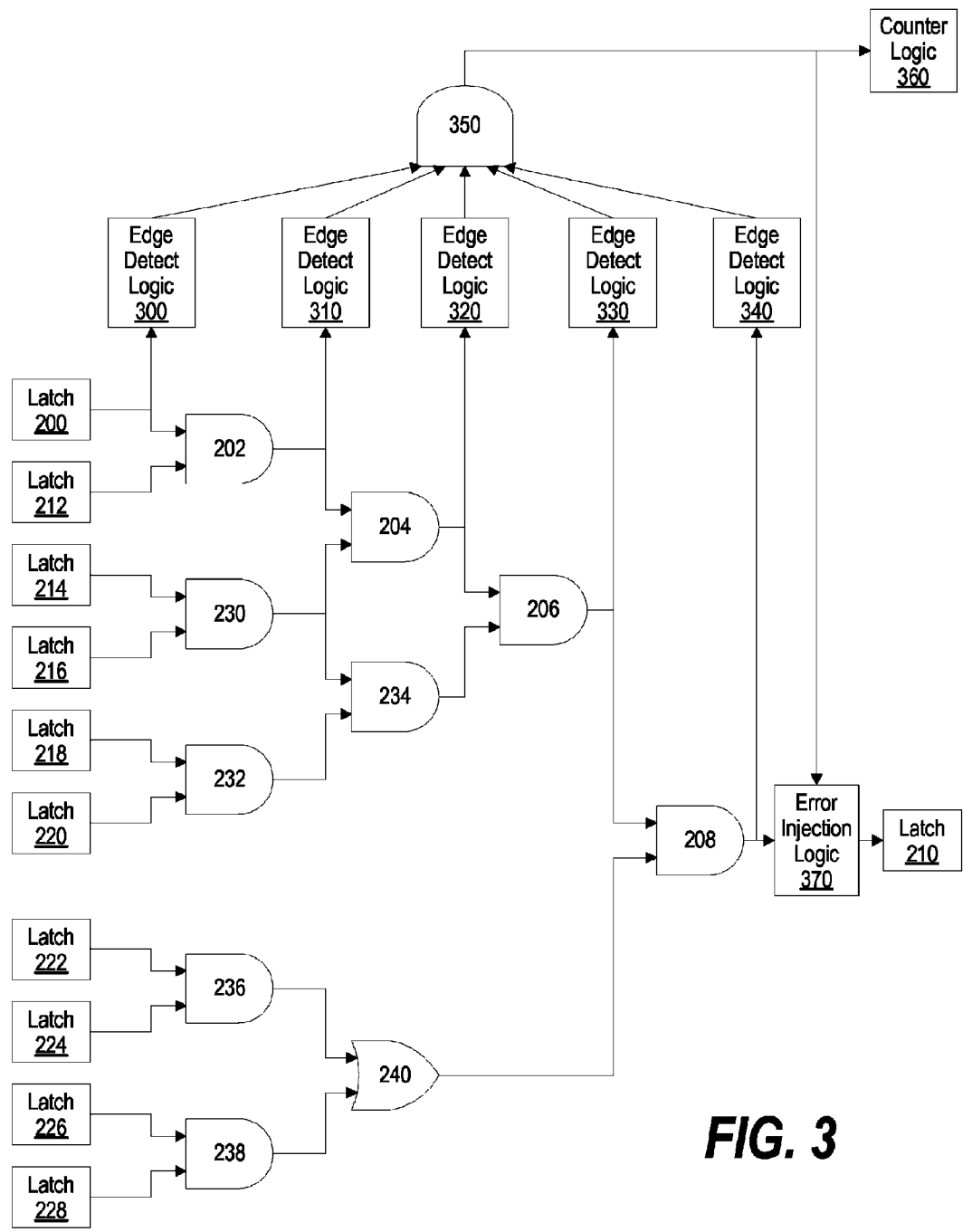
FIG. 3 is a diagram showing critical path measurement logic that is inserted between two latches to obtain critical path coverage information.

The critical path coverage analyzer adds critical path measurement logic, which includes the critical path logic cone, checking logic, and error injection logic into a simulation model as part of a process for modifying a simulator to match operating conditions consistent with a corresponding hardware device (see FIG. 3 and corresponding text for further details).

FIG. 3 is a diagram showing critical path measurement logic that is inserted between two latches in order to obtain critical path coverage information. A critical path coverage analyzer adds checking logic (edge detect logic 300-340, gate 350), counter logic 360, and error injection logic 370, along with a critical path logic cone, to a simulation model in order to analyze an application program's ability to adequately test an identified critical path.

The critical path coverage analyzer previously identified latches 200, 210, 212-228 and gates 202-208 and 230-240 as a cone of combinational logic that triggers a critical path along latch 200, through gates 202-208, an onto latch 210 (see FIG. 2 and corresponding text for further details). As such, the critical path coverage analyzer inserts edge detect logic 300-340 at particular points along the critical path in order to detect when an application program exercises the critical path. When exercised, the outputs of each of edge detect logic 300-340 are high, which feeds into gate 350 whose output becomes high. In turn, counter logic 360 increments a critical path counter value that tracks the number of times that the application program exercises the critical path.

Figure 4A:
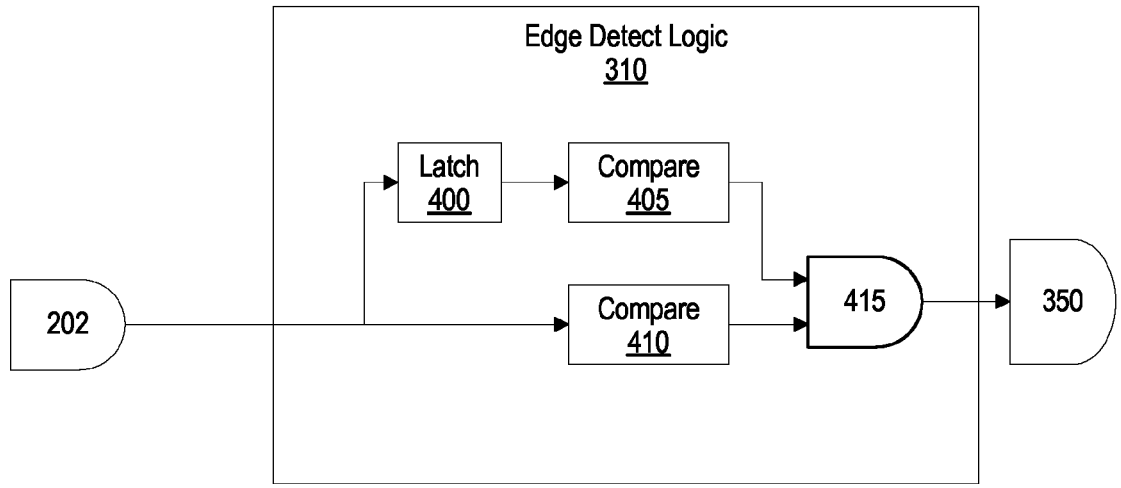
FIG. 4A is a diagram showing edge detect logic that is included in critical path measurement logic.
Figure 4B:
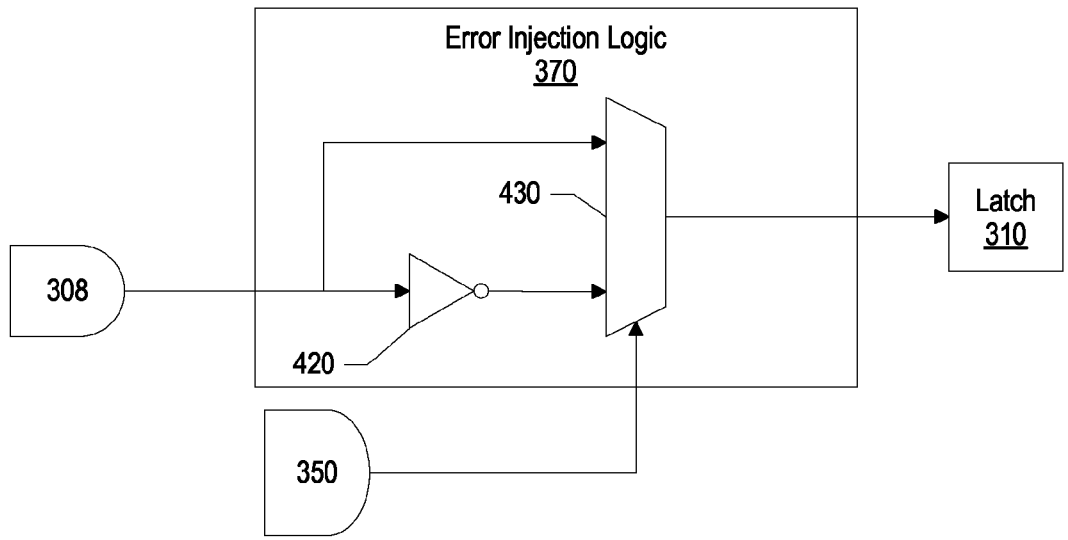
FIG. 4B is a diagram showing error injection logic that is included in critical path measurement logic.

In addition, gate 350's output controls a multiplexer within error injection logic 370 that injects an error into the critical path when gate 350's output is high (see FIG. 4B and corresponding text for further details).

FIG. 4A is a diagram showing edge detect logic that is included in critical path measurement logic. When an application program exercises a simulation program's critical path in which gate 202 includes, gate 202's output transitions. Edge detect logic 310 detects these transitions using latch 400, compare 405, 410, and gate 415.

Latch 400 connects to the critical path and saves the state of the critical path from the previous cycle. Compare 405 and 410 are logic that compares two inputs with each other, and outputs a high value if the inputs are the same (e.g., XNOR gate). Each of one of the inputs of compare 405 and 410 is set to a high or low value depending on the value that is necessary to sensitize the critical path based upon traversing the model.

When compare 410 receives an input that is the same as its set value, compare 410 generates a high value that is input to gate 415. When compare 405 receives an input, which is an input from the previous cycle, that is the same as its set value, compare 415 generates a high value that is also input to gate 415. The output of compare 405 and 410 provide a transition state on the critical path and, when both values are as expected, gate 415's output is high. This value feeds into gate 350, which detects when the entire critical path is exercised (see FIG. 3 and corresponding text for further details). Gate 202, edge detect logic 310, and gate 350 are the same as that shown in FIG. 3.

FIG. 4B is a diagram showing error injection logic that is included in critical path measurement logic. Error injection logic 370 is positioned between gate 208 and latch 310 in order to inject an error into a critical path when an application program exercises the critical path. Gate 350's output controls multiplexer 430 for selecting inverter 420's output when the application program exercises the critical path logic, thus injecting an error that feeds to latch 210. Otherwise, when the application program is not exercising the critical path, multiplexer 430 selects gate 208's output and passes a value through to latch 210 without injecting an error. Latch 210, gate 208, gate 350, and error injector logic 370 are the same as that shown in FIG. 1.

Figure 5:
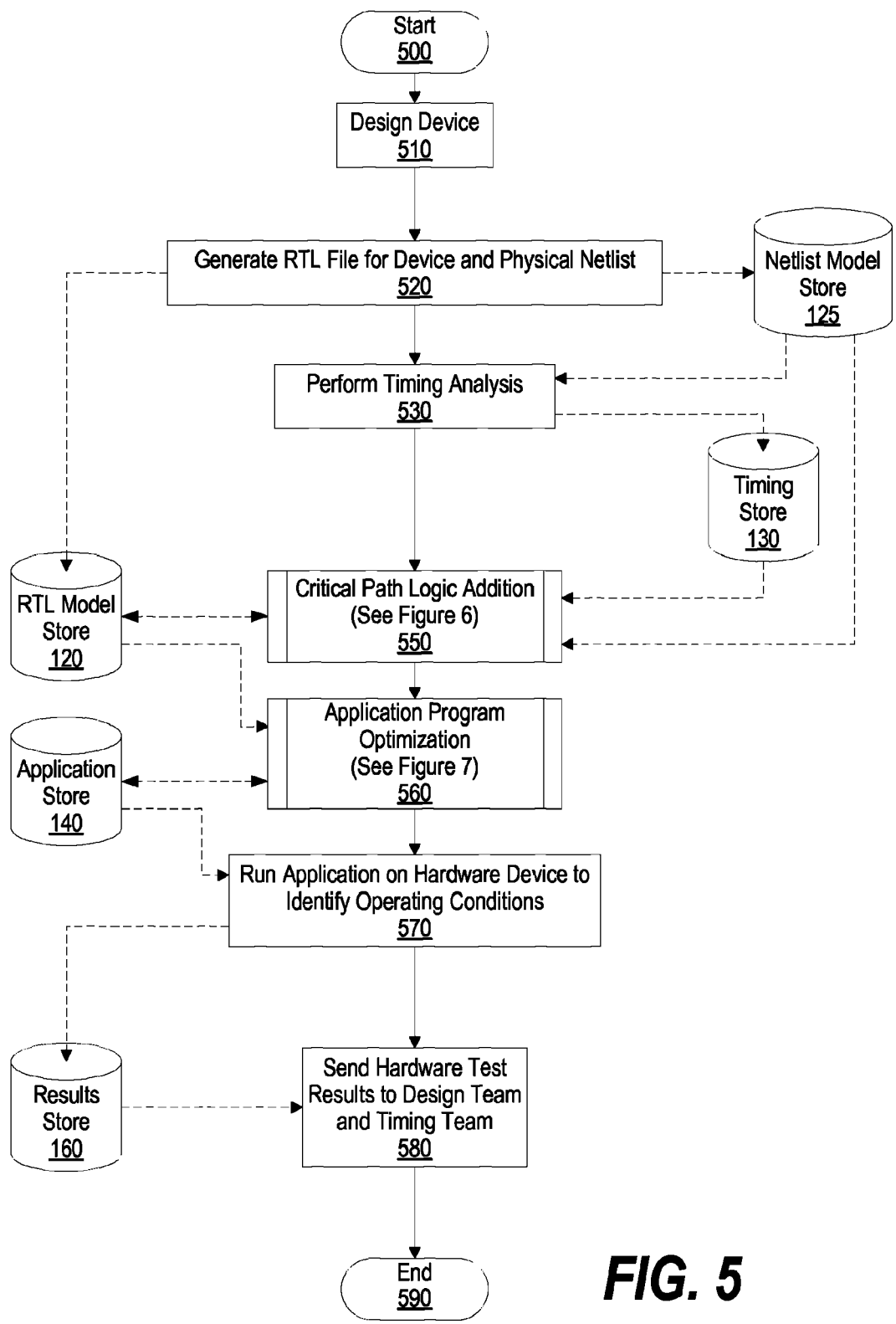
FIG. 5 is a high-level flowchart showing steps taken in modifying a simulation model and optimizing an application program in order to assess a hardware simulator's critical path evaluation ability.

FIG. 5 is a high-level flowchart showing steps taken in modifying a simulation model and optimizing an application program in order to assess a hardware simulator's critical path evaluation ability.

Processing commences at 500, whereupon a design team designs a particular device, such as a microprocessor (step 510). At step 520, processing generates a simulation model (e.g., register transfer language (RTL) model) and a physical design model (e.g., netlist model). Processing stores the RTL model in RTL model store 120 and stores the netlist model in netlist model store. At step 530, processing uses the netlist model to perform timing analysis, whose results are stored in timing store 130. The results include critical path information that identifies the critical paths of the design. RTL model store 120, netlist model store 125, and timing store 130 are the same as that shown in FIG. 1.

Figure 6:
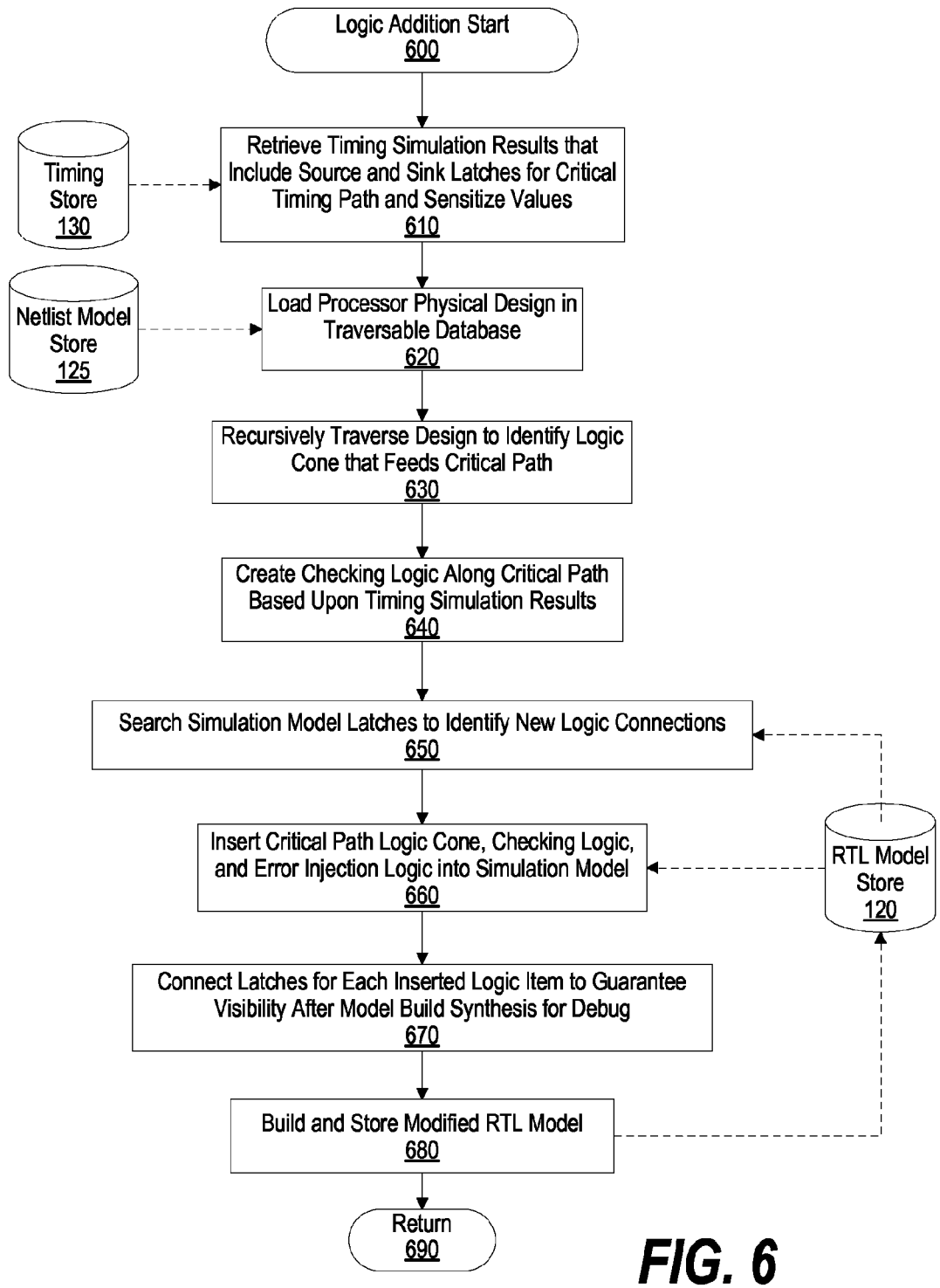
FIG. 6 is a flowchart showing steps taken in inserting critical path measurement logic into a simulation model.

Processing modifies the simulation model by adding critical path measurement logic to the simulation model based upon the timing results stored in timing store 130, and stores a modified simulation model in RTL model store 120 (pre-defined process block 550, see FIG. 6 and corresponding text for further details). Once processing adds the critical path measurement logic to the simulation model, processing modifies and optimizes an application program to adequately test the critical path logic (pre-defined process block 560, see FIG. 7 and corresponding text for further details).

Next, at step 570, processing executes the optimized program on an actual hardware device (corresponds to simulator 100) in order to identify the hardware device's operating conditions (e.g., frequency range, temperature range, etc.), which are stored in results store 160. Processing sends the hardware-identified operating conditions from results store 160 to a design team and timing team for further evaluation as to whether to modify the simulation model to correspond with the hardware-identified operating conditions. Results store 160 and simulation timing team 170 are the same as that shown in FIG. 1. Processing ends at 599.

FIG. 6 is a flowchart showing steps taken in inserting critical path measurement logic into a simulation model. Processing previously simulated a simulation model, which generated timing results (see FIG. 5 and corresponding text for further details). Processing now proceeds through a series of steps to add critical path measurement logic to the simulation model based upon the timing results.

Processing commences at 600, whereupon processing retrieves the timing results from timing store 130 (step 610). The timing results include critical path information, such as between two latches (source latch and sink latch). At step 620, processing loads a physical design file from netlist model store 125 into a traversable data base and, at step 630, processing recursively traverses the physical design file in order to identify a cone of logic that feeds the critical path, such a number of "AND" gates and "OR" gates (see FIG. 2 and corresponding text for further details). Timing store 130 and netlist model store 125 are the same as that shown in FIG. 1.

Processing then creates checking logic along critical path logic included in the identified cone of logic based upon the timing results (step 640). At step 650, processing retrieves the simulation model from RTL model store 120 and searches the latches included in the simulation model in order to identify new logic connections to insert critical path measurement logic, which comprises the critical path logic cone (includes critical path logic), checking logic, and error injection logic. The checking logic comprises a critical path counter that tracks the number of times that the critical path logic is exercised by an application program. The error injection logic injects an error into the critical path in order to determine whether the application program detects the injected error (see FIGS. 2, 4B, 7, 8, and corresponding text for further details). RTL model store 120 is the same as that shown in FIG. 1.

At step 660, processing inserts the critical path measurement logic into the simulation model and, at step 670, processing connects latches for each inserted logic item in order to guarantee visibility after the simulation model is synthesized for debug purposes. Processing then builds and stores the modified simulation model in RTL model store 120 at step 680. Model store 120 is the same as that shown in FIG. 1. Processing returns at 690.

Figure 7:
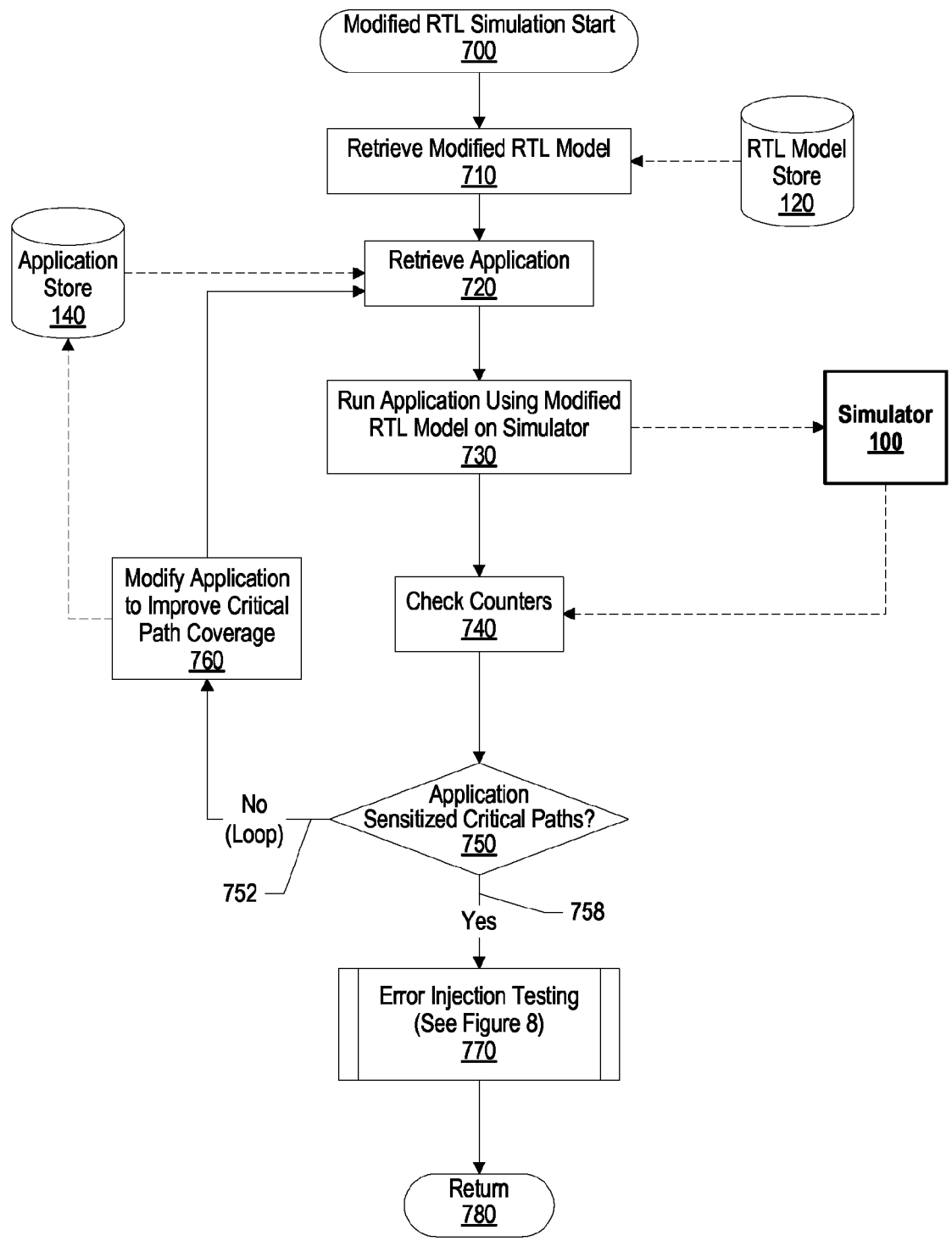
FIG. 7 is a flowchart showing steps taken in modifying an application program in order to exercise critical path logic included in a simulation model.

FIG. 7 is a flowchart showing steps taken in modifying an application program in order to adequately exercise critical path logic included in a simulation model.

Processing commences at 700, whereupon processing retrieves a modified simulation model from RTL model store 120 at step 710. The modified simulation model includes critical path measurement logic for assessing the critical path of the simulation model. At step 720, processing retrieves an application from application store 140 for executing on the modified simulation model. RTL model store 120 and application store 140 are the same as that shown in FIG. 1.

Processing executes the application program on the modified simulation model by using simulator 100 at step 730. At step 740, processing checks a critical path counter value that a critical path counter tracks. The critical path counter is part of the critical path measurement logic and tracks the number of times that the application program exercises the critical path logic (see FIG. 3 and corresponding text for further details).

A determination is made as to whether the application program exercised the critical path logic (or each critical path logic identified in the simulation model), such as whether the critical path counter value exceeded a critical path exercise threshold set by a simulator design team (decision 750). If the application program did not exercise the critical path an acceptable number of times, decision 750 branches to "No" branch 752 whereupon processing modifies the application program in order to improve the application program's critical path coverage (step 760) and retests the application program. This looping continues until the application program adequately exercised the critical path logic, at which point decision 750 branches to "Yes" branch 758.

Figure 8:
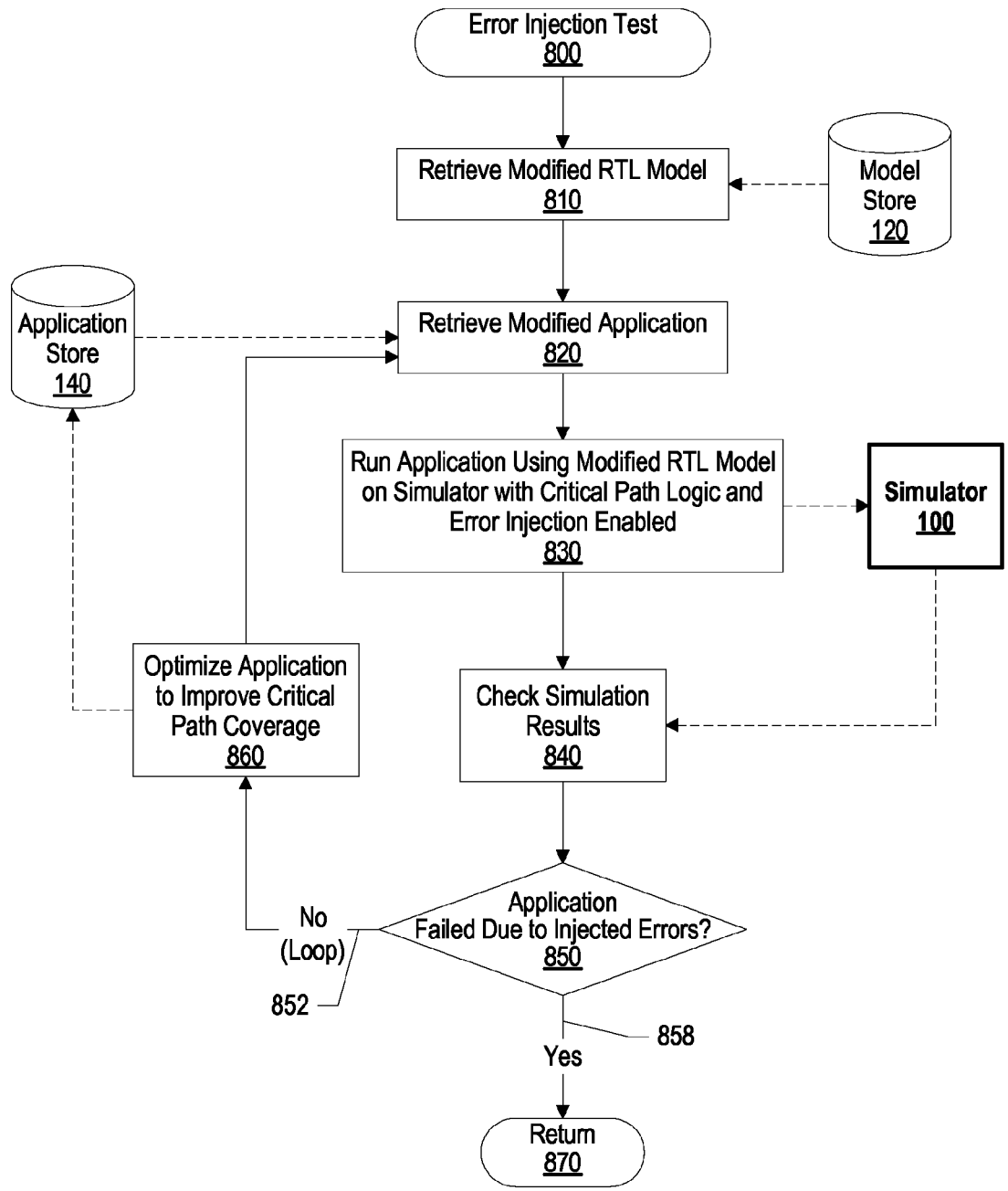
FIG. 8 is a flowchart showing steps taken in optimizing an application program in order to detect errors that are injected into critical path logic within a simulation model.

Processing then runs the modified application program while injecting errors into the critical path in order to determine whether the modified application program detects the injected errors (pre-defined processing block 770, see FIG. 8 and corresponding text for further details). Processing returns at 780.

FIG. 8 is a flowchart showing steps taken in optimizing an application program in order to detect errors that are injected into critical path logic within a simulation model.

Processing commences at 800, whereupon processing retrieves a modified simulation model from RTL model store 120 (step 810). The modified simulation model includes critical path measurement logic that provides information corresponding an application program's ability to test a simulation model's critical path. Processing, at step 820, retrieves a modified application program from application store 140 that has been modified to adequately exercise critical paths included in the simulation model (see FIG. 7 and corresponding text for further details). RTL model store 120 and application store 140 are the same as that shown in FIG. 1.

At step 830, processing executes the modified application program on the modified simulation model by using simulator 100. During simulation, error injection logic injects errors into the critical path when the application program exercises the critical path in order to identify whether the application program detects the injected errors (see FIG. 4B and corresponding text for further details). Simulator 100 is the same as that shown in FIG. 1.

Processing checks the simulation results at step 840, and a determination is made as to whether the application program failed due to the injected errors (e.g., detected the injected error) (decision 850). If the application program did not fail, decision 850 branches to "No" branch 852, which loops back to optimize (step 860) and re-test the application program. This looping continues until the application program fails from the injected errors, at which point decision 850 branches to "Yes" branch 858. Processing returns at 870.

Figure 9:
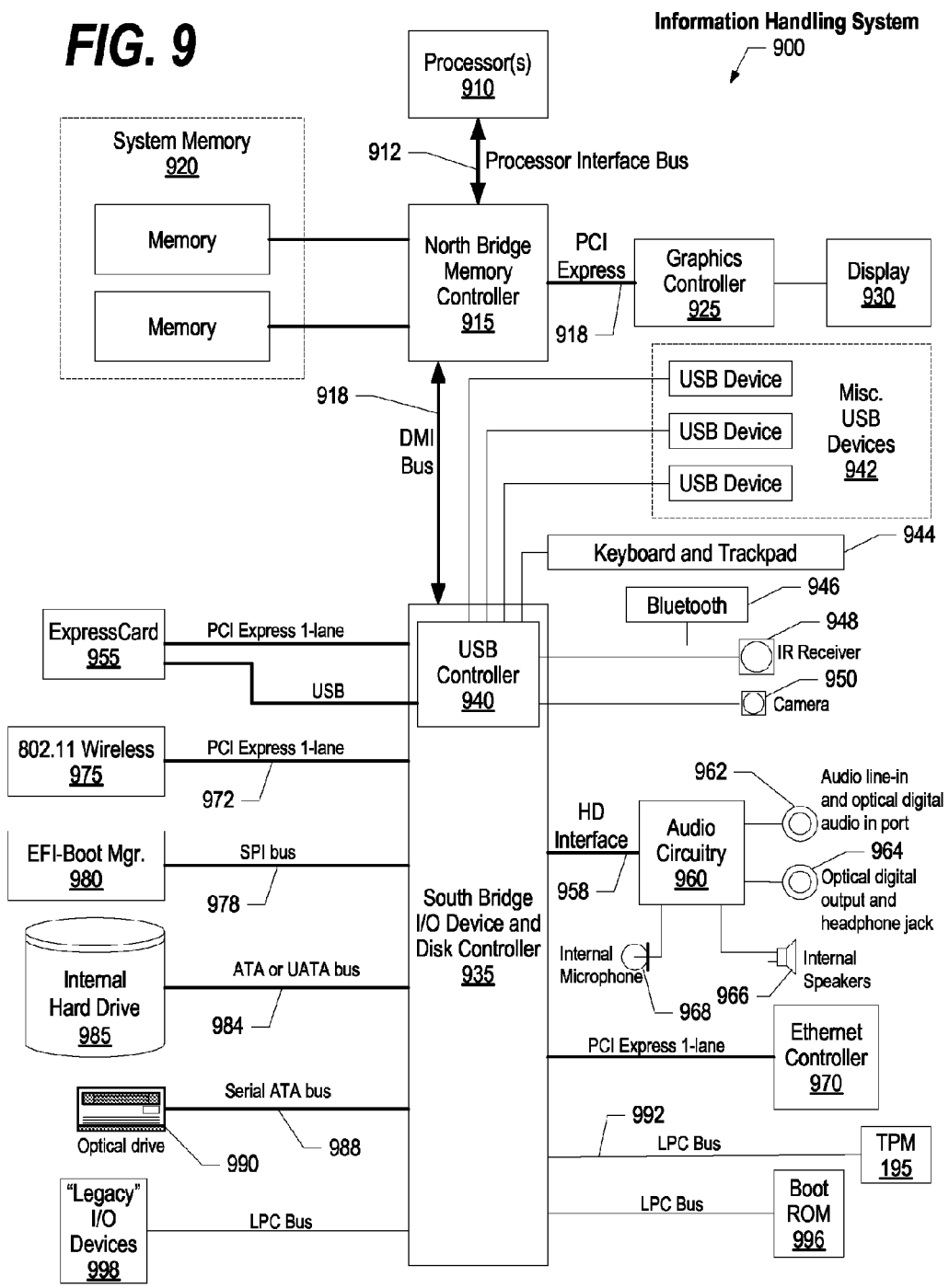
FIG. 9 is a block diagram of a data processing system in which the methods described herein can be implemented.

FIG. 9 illustrates information handling system 900 which is a simplified example of a computer system capable of performing the computing operations described herein. Information handling system 900 includes one or more processors 910 which is coupled to processor interface bus 912. Processor interface bus 912 connects processors 910 to Northbridge 915, which is also known as the Memory Controller Hub (MCH). Northbridge 915 is connected to system memory 920 and provides a means for processor(s) 910 to access the system memory. Graphics controller 925 is also connected to Northbridge 915. In one embodiment, PCI Express bus 918 is used to connect Northbridge 915 to graphics controller 925. Graphics controller 925 is connected to display device 930, such as a computer monitor.

Northbridge 915 and Southbridge 935 are connected to each other using bus 918. In one embodiment, the bus is a Direct Media Interface (DMI) bus that transfers data at high speeds in each direction between Northbridge 915 and Southbridge 935. In another embodiment, a Peripheral Component Interconnect (PCI) bus is used to connect the Northbridge and the Southbridge. Southbridge 935, also known as the I/O Controller Hub (ICH) is a chip that generally implements capabilities that operate at slower speeds than the capabilities provided by the Northbridge. Southbridge 935 typically provides various busses used to connect various components. These busses can include PCI and PCI Express busses, an ISA bus, a System Management Bus (SMBus or SMB), a Low Pin Count (LPC) bus. The LPC bus is often used to connect low-bandwidth devices, such as boot ROM 996 and "legacy" I/O devices (using a "super I/O" chip). The "legacy" I/O devices (998) can include serial and parallel ports, keyboard, mouse, floppy disk controller. The LPC bus is also used to connect Southbridge 935 to Trusted Platform Module (TPM) 995. Other components often included in Southbridge 935 include a Direct Memory Access (DMA) controller, a Programmable Interrupt Controller (PIC), a storage device controller, which connects Southbridge 935 to nonvolatile storage device 985, such as a hard disk drive, using bus 984.

ExpressCard 955 is a slot used to connect hot-pluggable devices to the information handling system. ExpressCard 955 supports both PCI Express and USB connectivity as it is connected to Southbridge 935 using both the Universal Serial Bus (USB) the PCI Express bus. Southbridge 935 includes USB Controller 940 that provides USB connectivity to devices that connect to the USB. These devices include webcam (cameral) 950, infrared (IR) receiver 948, Bluetooth device 946 which provides for wireless personal area networks (PANs), keyboard and trackpad 944, and other miscellaneous USB connected devices 942, such as a mouse, portable storage devices, modems, network cards, ISDN connectors, fax, printers, USB hubs, and many other types of USB connected devices.

Wireless Local Area Network (LAN) device 975 is connected to Southbridge 935 via the PCI or PCI Express bus 972. LAN device 975 typically implements one of the IEEE 802.11 standards of over-the-air modulation techniques that all use the same protocol to wireless communicate between information handling system 900 and another computer system or device. Optical storage device 990 is connected to Southbridge 935 using Serial ATA (SATA) bus 988. Serial ATA adapters and devices communicate over a high-speed serial link. The Serial ATA bus is also used to connect Southbridge 935 to other forms of storage devices, such as hard disk drives. Audio circuitry 960, such as a sound card, is connected to Southbridge 935 via bus 958. Audio circuitry 960 is used to provide functionality such as audio line-in and optical digital audio in port 962, optical digital output and headphone jack 964, internal speakers 966, and internal microphone 968. Ethernet controller 970 is connected to Southbridge 935 using a bus, such as the PCI or PCI Express bus. Ethernet controller 970 is used to connect information handling system 900 with a computer network, such as a Local Area Network (LAN), the Internet, and other public and private computer networks.

While FIG. 9 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 995) shown in FIG. 9 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 10.

Figure 10:
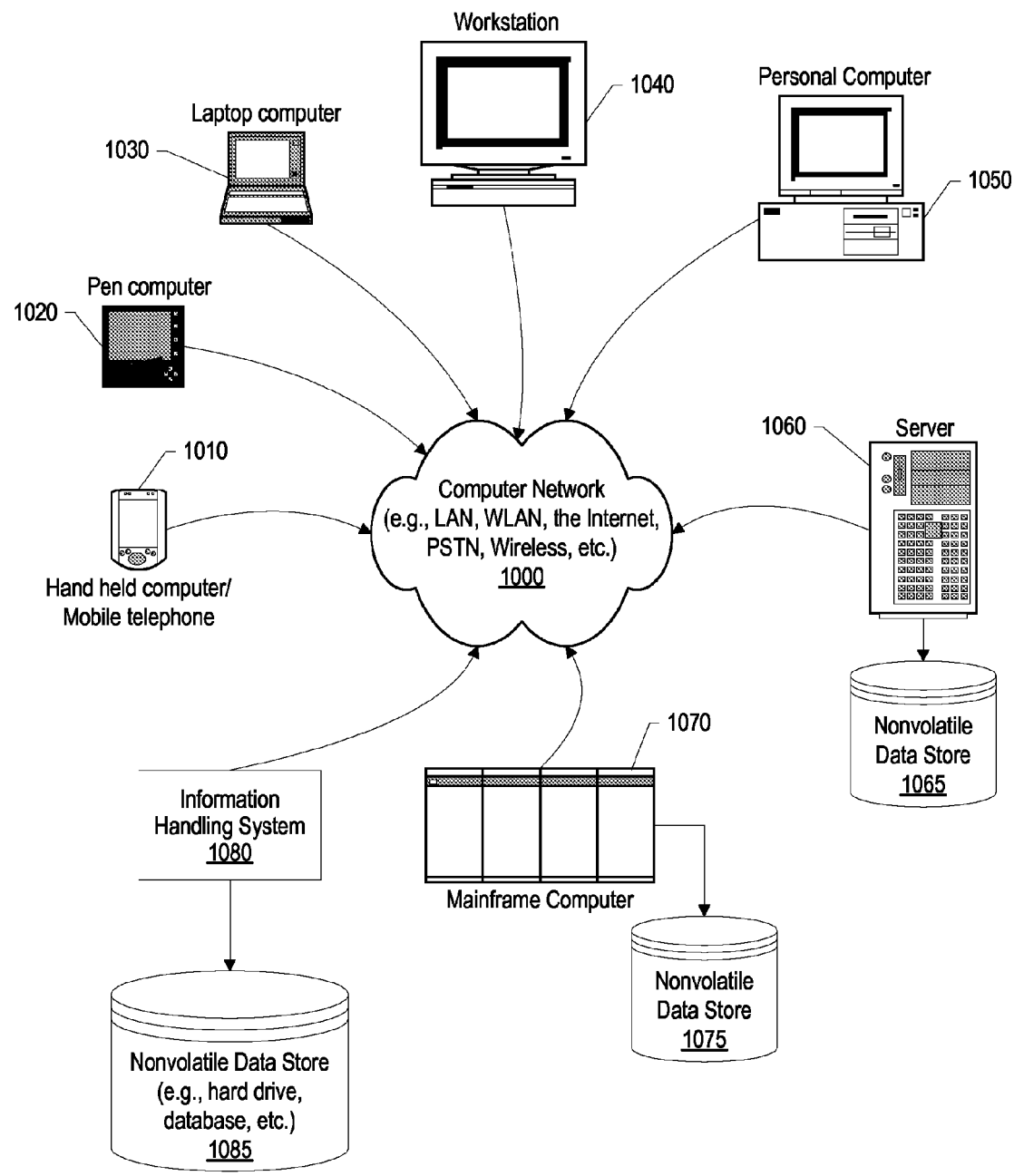
FIG. 10 provides an extension of the information handling system environment shown in FIG. 9 to illustrate that the methods described herein can be performed on a wide variety of information handling systems that operate in a networked environment.

FIG. 10 provides an extension of the information handling system environment shown in FIG. 9 to illustrate that the methods described herein can be performed on a wide variety of information handling systems which operate in a networked environment. Types of information handling systems range from small handheld devices, such as handheld computer/mobile telephone 1010 to large mainframe systems, such as mainframe computer 1070. Examples of handheld computer 1010 include personal digital assistants (PDAs), personal entertainment devices, such as MP3 players, portable televisions, and compact disc players. Other examples of information handling systems include pen, or tablet, computer 1020, laptop, or notebook, computer 1030, workstation 1040, personal computer system 1050, and server 1060. Other types of information handling systems that are not individually shown in FIG. 10 are represented by information handling system 1080. As shown, the various information handling systems can be networked together using computer network 1000. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling system include nonvolatile data stores, such as hard drives and/or nonvolatile memory. Some of the information handling systems shown in FIG. 10 are depicted with separate nonvolatile data stores (server 1060 is shown with nonvolatile data store 1065, mainframe computer 1070 is shown with nonvolatile data store 1075, and information handling system 1080 is shown with nonvolatile data store 1085). The nonvolatile data store can be a component that is external to the various information handling systems or can be internal to one of the information handling systems. In addition, while not shown, an individual nonvolatile data store can be shared amongst two or more information handling systems using various techniques.

One of the preferred implementations of the invention is a client application, namely, a set of instructions (program code) in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive). Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer-implemented method comprising:
    retrieving a simulation model and timing results that correspond to the simulation model, the simulation model synthesized from a physical design file and the timing results generated from a physical design model that corresponds to the physical design file;
    identifying a critical path that resides between two components included in the simulation model based upon the timing results;
    inserting critical path measurement logic between the two components that is visible after synthesis, the critical path measurement logic including critical path logic and a critical path counter, the critical path logic corresponding to the identified critical path and the critical path counter including a critical path counter value that indicates a number of times that an application program exercises the critical path logic;
    re-synthesizing the simulation model using the simulator after inserting the critical path measurement logic, resulting in a modified simulation model;
    simulating the modified simulation model, which produces simulator-identified operating conditions based upon the critical path; and
    modifying the simulator based upon the simulator-identified operating conditions.

2. The method of claim 1 wherein the simulating is performed using an application program, the method further comprising:

in response to determining that the critical path counter value did not exceed a critical path exercise threshold, modifying the application program in order to increase the number of times that the application program exercises the critical path logic.

3. The method of claim 2 further comprising:
injecting an error into the critical path measurement logic at a point in time when the modified application program exercises the critical path logic;
determining whether the modified application program detected the injected error; and
in response to determining that the modified application program did not detect the injected error, optimizing the modified application program to detect the injected error.

4. The method of claim 3 further comprising:
executing the optimized application program on a hardware device that corresponds to the physical design file, the executing resulting in hardware test results that identify one or more hardware-identified operating conditions.

5. The method of claim 4 further comprising:
comparing the hardware-identified operating conditions against the simulator-identified operating conditions;
determining that the hardware-identified operating conditions are different than the simulator-identified operating conditions; and
performing the modifying of the simulator in response to determining that the hardware-identified operating conditions are different than the simulator-identified operating conditions.

6. The method of claim 1 further comprising:
loading the physical design file into a traversable database; and
recursively traversing the physical design file to identify the critical path.

7. The method of claim 1 wherein the simulation model is a register transfer language file and the physical design model is a netlist model.

8. A computer program product stored on a computer operable media, the computer operable media containing instructions for execution by a computer, which, when executed by the computer, cause the computer to implement a method of simulator optimization, the method comprising:
retrieving a simulation model and timing results that correspond to the simulation model, the simulation model synthesized from a physical design file and the timing results generated from a physical design model that corresponds to the physical design file;
identifying a critical path that resides between two components included in the simulation model based upon the timing results;
inserting critical path measurement logic between the two components that is visible after synthesis, the critical path measurement logic including critical path logic and a critical path counter, the critical path logic corresponding to the identified critical path and the critical path counter including a critical path counter value that indicates a number of times that an application program exercises the critical path logic;
re-synthesizing the simulation model using the simulator after inserting the critical path measurement logic, resulting in a modified simulation model;
simulating the modified simulation model using the modified application program, which produces simulator-identified operating conditions based upon the critical path; and
modifying the simulator based upon the simulator-identified operating conditions.

9. The computer program product of claim 8 wherein the simulating is performed using an application program, the method further comprising:
in response to determining that the critical path counter value did not exceed a critical path exercise threshold, modifying the application program in order to increase the number of times that the application program exercises the critical path logic.

10. The computer program product of claim 9 wherein the method further comprises:
injecting an error into the critical path measurement logic at a point in time when the modified application program exercises the critical path logic;
determining whether the modified application program detected the injected error; and
in response to determining that the modified application program did not detect the injected error, optimizing the modified application program to detect the injected error.

11. The computer program product of claim 10 wherein the method further comprises:
executing the optimized application program on a hardware device that corresponds to the physical design file, the executing resulting in hardware test results that identify one or more hardware-identified operating conditions.

12. The computer program product of claim 11 wherein the method further comprises:
comparing the hardware-identified operating conditions against the simulator-identified operating conditions;
determining that the hardware-identified operating conditions are different than the simulator-identified operating conditions; and
performing the modifying of the simulator in response to determining that the hardware-identified operating conditions are different than the simulator-identified operating conditions.

13. The computer program product of claim 8 wherein the method further comprises:
loading the physical design file into a traversable database; and
recursively traversing the physical design file to identify the critical path.

14. The computer program product of claim 8 wherein the simulation model is a register transfer language file and the physical design model is a netlist model.

15. An information handling system comprising:
one or more processors;
a memory accessible by the processors;
one or more nonvolatile storage devices accessible by the processors; and
a set of instructions stored in the memory of one of the processors, wherein one or more of the processors executes the set of instructions in order to perform actions of:
retrieving a simulation model and timing results that correspond to the simulation model from one of the nonvolatile storage devices, the simulation model synthesized from a physical design file and the timing results generated from a physical design model that corresponds to the physical design file;
identifying a critical path that resides between two components included in the simulation model based upon the timing results;

inserting critical path measurement logic between the two components that is visible after synthesis, the critical path measurement logic including critical path logic and a critical path counter, the critical path logic corresponding to the identified critical path and the critical path counter including a critical path counter value that indicates a number of times that an application program exercises the critical path logic;

re-synthesizing the simulation model using the simulator after inserting the critical path measurement logic, resulting in a modified simulation model;

simulating the modified simulation model using the modified application program, which produces simulator-identified operating conditions based upon the critical path; and modifying the simulator based upon the simulator-identified operating conditions.

16. The information handling system of claim 15 wherein the simulating is performed using an application program, the information handling system further comprising an additional set of instructions in order to perform actions of:

in response to determining that the critical path counter value did not exceed a critical path exercise threshold, modifying the application program in order to increase the number of times that the application program exercises the critical path logic.

17. The information handling system of claim 16 further comprising an additional set of instructions in order to perform actions of:

injecting an error into the critical path measurement logic at a point in time when the modified application program exercises the critical path logic;

determining whether the modified application program detected the injected error; and in response to determining that the modified application program did not detect the injected error, optimizing the modified application program to detect the injected error.

18. The information handling system of claim 17 further comprising an additional set of instructions in order to perform actions of:

executing the optimized application program on a hardware device that corresponds to the physical design file, the executing resulting in hardware test results that identify one or more hardware-identified operating conditions.

19. The information handling system of claim 18 further comprising an additional set of instructions in order to perform actions of:

comparing the hardware-identified operating conditions against the simulator-identified operating conditions;

determining that the hardware-identified operating conditions are different than the simulator-identified operating conditions; and performing the modifying of the simulator in response to determining that the hardware-identified operating conditions are different than the simulator-identified operating conditions.

20. The information handling system of claim 15 further comprising an additional set of instructions in order to perform actions of:

loading the physical design file into a traversable database; and recursively traversing the physical design file to identify the critical path.

\* \* \* \* \*